(12) United States Patent
Teranishi et al.

(10) Patent No.: US 9,797,925 B2
(45) Date of Patent: Oct. 24, 2017

(54) PROBE PIN AND ELECTRONIC DEVICE USING THE SAME

(71) Applicant: OMRON Corporation, Kyoto-shi, Kyoto (JP)

(72) Inventors: Hirotada Teranishi, Osaka (JP); Takahiro Sakai, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/318,092

(22) PCT Filed: Jun. 4, 2015

(86) PCT No.: PCT/JP2015/066220
§ 371 (c)(1),
(2) Date: Dec. 12, 2016

(87) PCT Pub. No.: WO2015/194384
PCT Pub. Date: Dec. 23, 2015

(65) Prior Publication Data
US 2017/0138985 A1    May 18, 2017

(30) Foreign Application Priority Data
Jun. 16, 2014  (JP) ................................ 2014-123528

(51) Int. Cl.
H01R 13/24     (2006.01)
G01R 1/067     (2006.01)
H01R 4/48      (2006.01)

(52) U.S. Cl.
CPC .......... *G01R 1/06722* (2013.01); *H01R 4/48* (2013.01)

(58) Field of Classification Search
CPC .................................................. H01R 13/2421
USPC .......................................... 439/66, 700, 824
See application file for complete search history.

(56) References Cited

U.S. PATENT DOCUMENTS

| 7,025,602 | B1 * | 4/2006 | Hwang | H01R 13/2421 439/66 |
| 7,467,952 | B2 * | 12/2008 | Hsiao | H01R 13/2421 439/66 |
| 7,559,769 | B2 * | 7/2009 | Hsiao | H01R 12/52 439/66 |
| 7,789,671 | B2 * | 9/2010 | Hsieh | G01R 1/06722 439/66 |
| 7,815,440 | B2 * | 10/2010 | Hsieh | H01R 13/2421 439/66 |
| 7,841,864 | B2 * | 11/2010 | Hsiao | H01R 13/2421 439/66 |

(Continued)

FOREIGN PATENT DOCUMENTS

JP   2012-181096 A   9/2012
JP   2013-511039 A   3/2013

(Continued)

*Primary Examiner* — Neil Abrams
(74) *Attorney, Agent, or Firm* — Metrolexis Law Group, PLLC

(57) ABSTRACT

A probe pin includes a coil spring, a first plunger, and second and third plungers. The second and third plungers respectively are independently operable and include a main body and first and second elastic pieces that extend from the main body in the same direction to each other. The first plunger is inserted between the first and second elastic pieces each of the second and third plungers.

8 Claims, 12 Drawing Sheets

(56) References Cited

U.S. PATENT DOCUMENTS

| | | | | |
|---|---|---|---|---|
| 7,845,988 B2* | 12/2010 | Hsiao | ............... | H01R 13/2421 |
| | | | | 439/66 |
| 8,373,430 B1* | 2/2013 | Sochor | ............... | H01R 13/2421 |
| | | | | 29/874 |
| 8,460,010 B2* | 6/2013 | Kimura | ............... | G01R 1/06722 |
| | | | | 439/66 |
| 8,715,015 B2* | 5/2014 | Hwang | ............... | G01R 1/06722 |
| | | | | 439/700 |
| 8,721,372 B2* | 5/2014 | Hasegawa | ............ | G01R 1/0483 |
| | | | | 439/66 |
| 8,808,037 B2* | 8/2014 | Park | ............... | H01R 12/714 |
| | | | | 439/66 |
| 8,808,038 B2* | 8/2014 | Hwang | ............... | G01R 1/06722 |
| | | | | 439/66 |
| 9,088,083 B2* | 7/2015 | Mason | ............... | H05K 7/1069 |
| 9,190,749 B2* | 11/2015 | Chen | ............... | H01R 12/714 |
| D776,552 S * | 1/2017 | Teranishi | ............... | D10/78 |
| 9,595,773 B2* | 3/2017 | Hemmi | ............ | H01R 13/2421 |
| 2010/0035483 A1 | 2/2010 | Hsieh et al. | | |
| 2010/0068947 A1* | 3/2010 | Hsiao | ............... | G01R 1/06722 |
| | | | | 439/786 |
| 2011/0230105 A1 | 9/2011 | Hsu et al. | | |
| 2012/0238136 A1 | 9/2012 | Hwang | | |
| 2017/0115324 A1* | 4/2017 | Teranishi | ............ | G01R 1/06722 |
| 2017/0138985 A1* | 5/2017 | Teranishi | ............... | H01R 4/48 |

FOREIGN PATENT DOCUMENTS

| | | |
|---|---|---|
| WO | 2007077784 A1 | 7/2007 |
| WO | 2011036800 A1 | 3/2011 |

\* cited by examiner

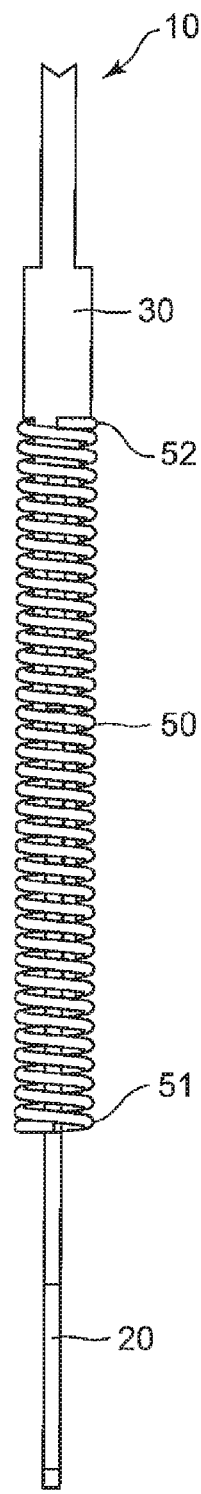
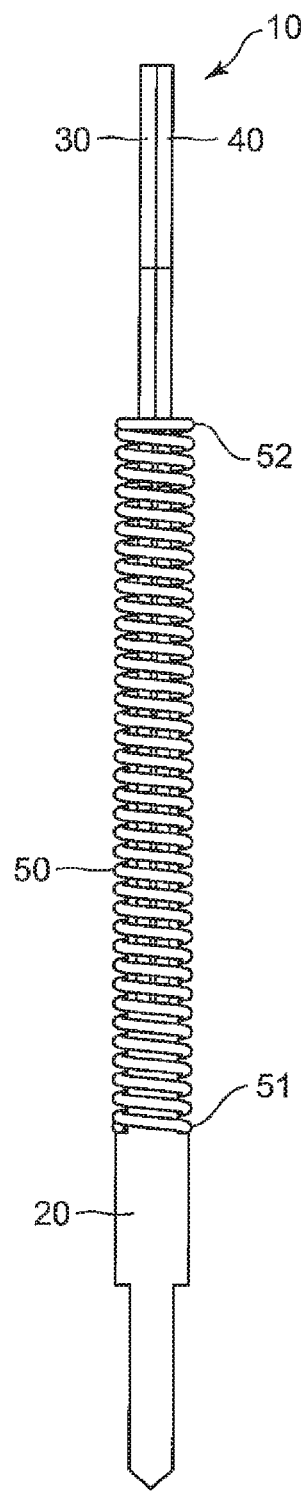
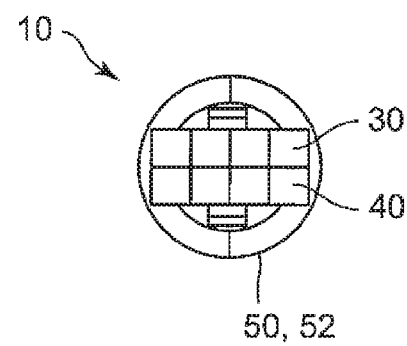
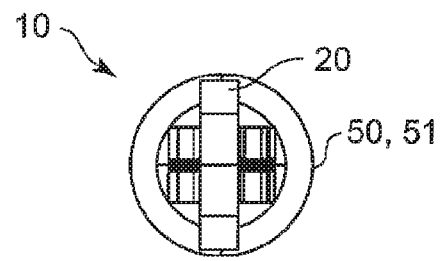

Fig.3A
Fig.3B
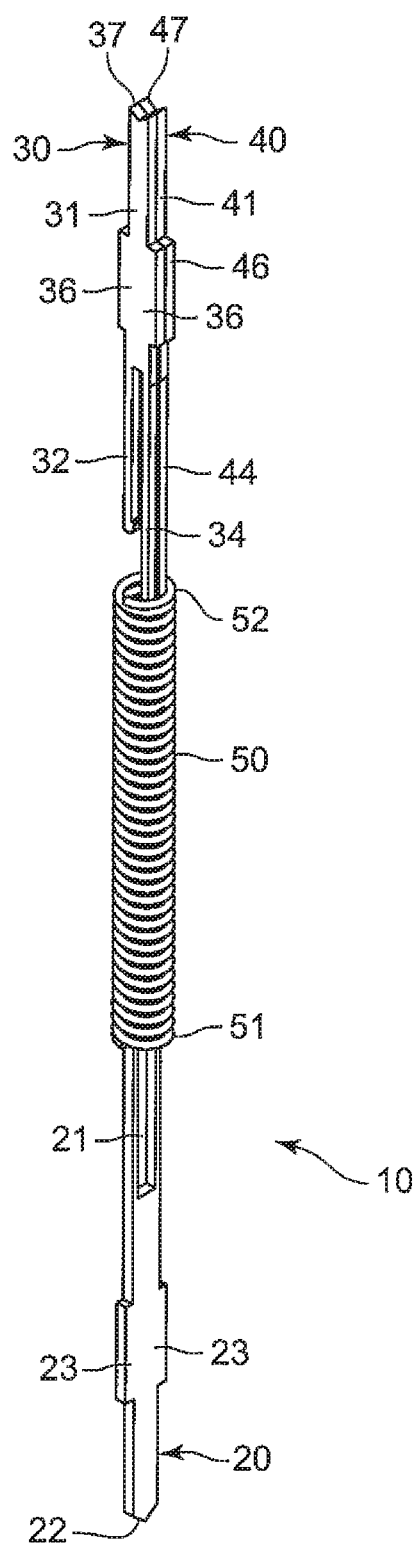
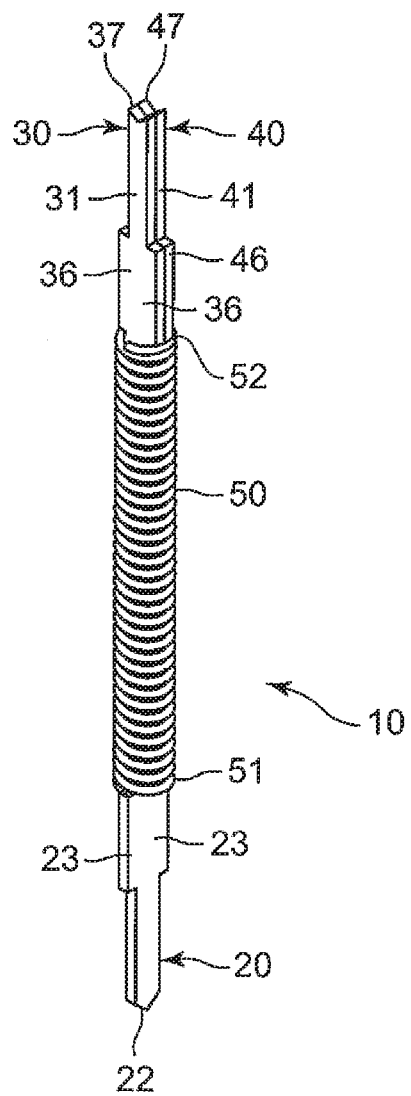

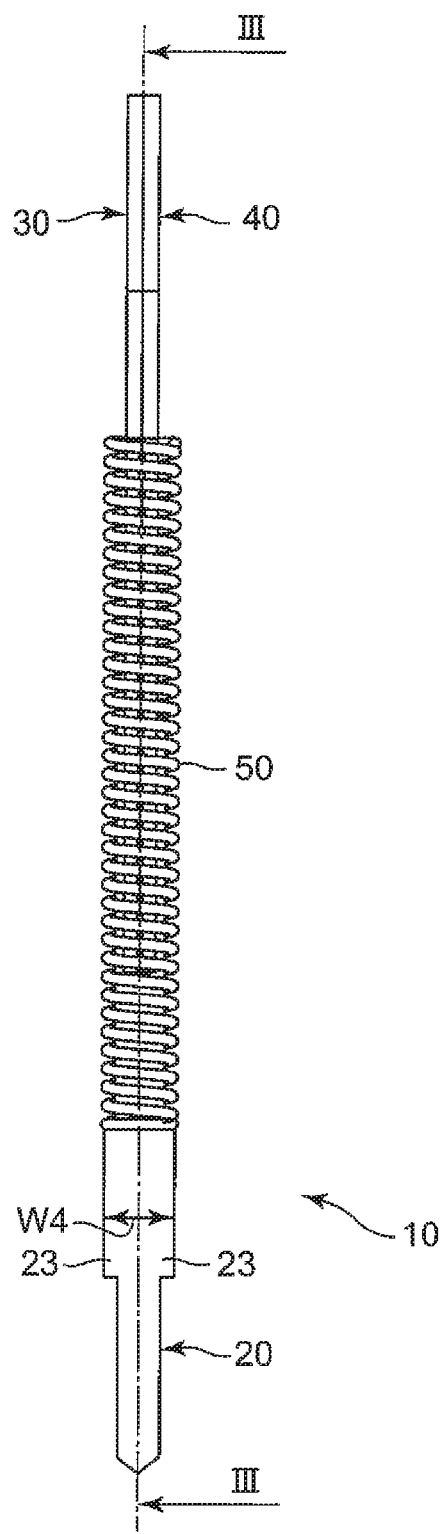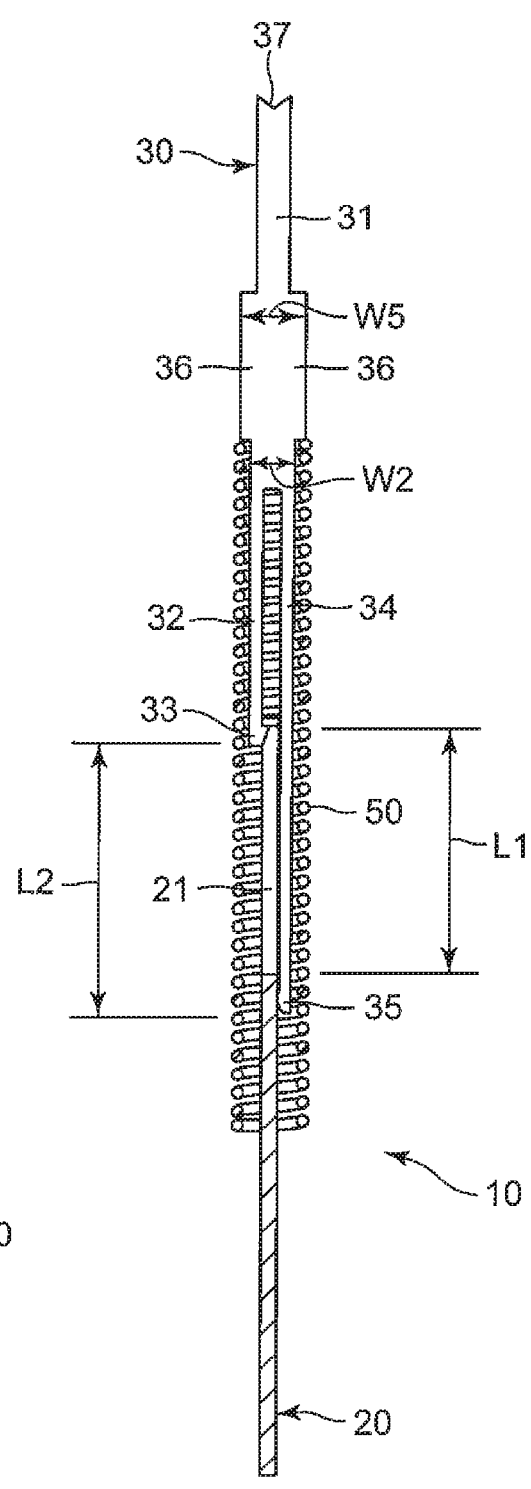

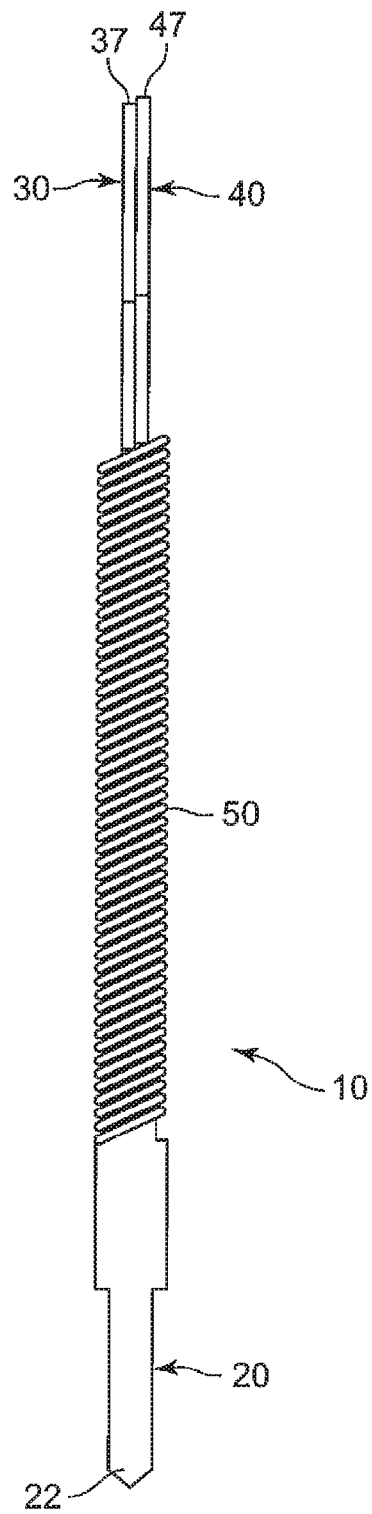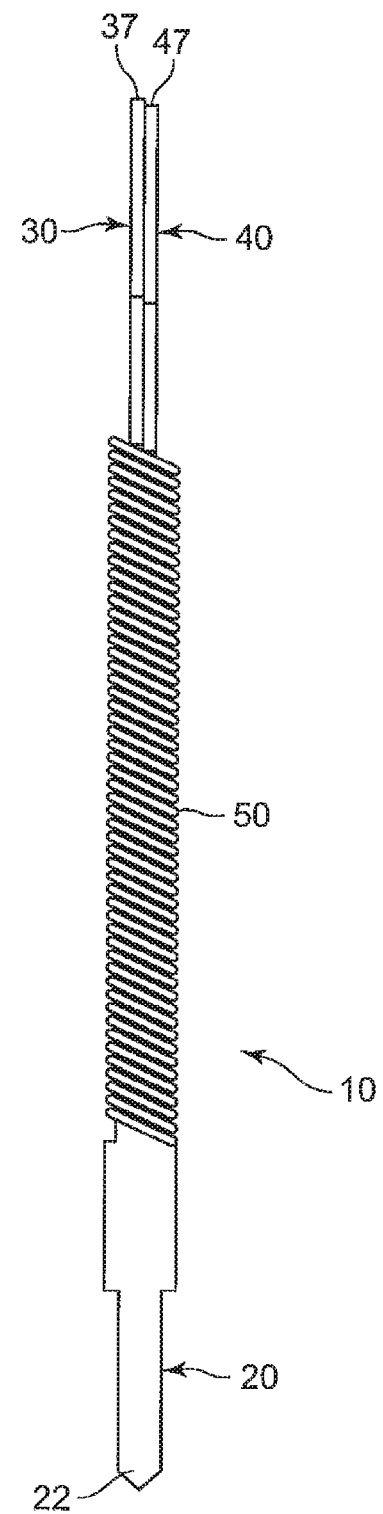
Fig.5A
Fig.5B

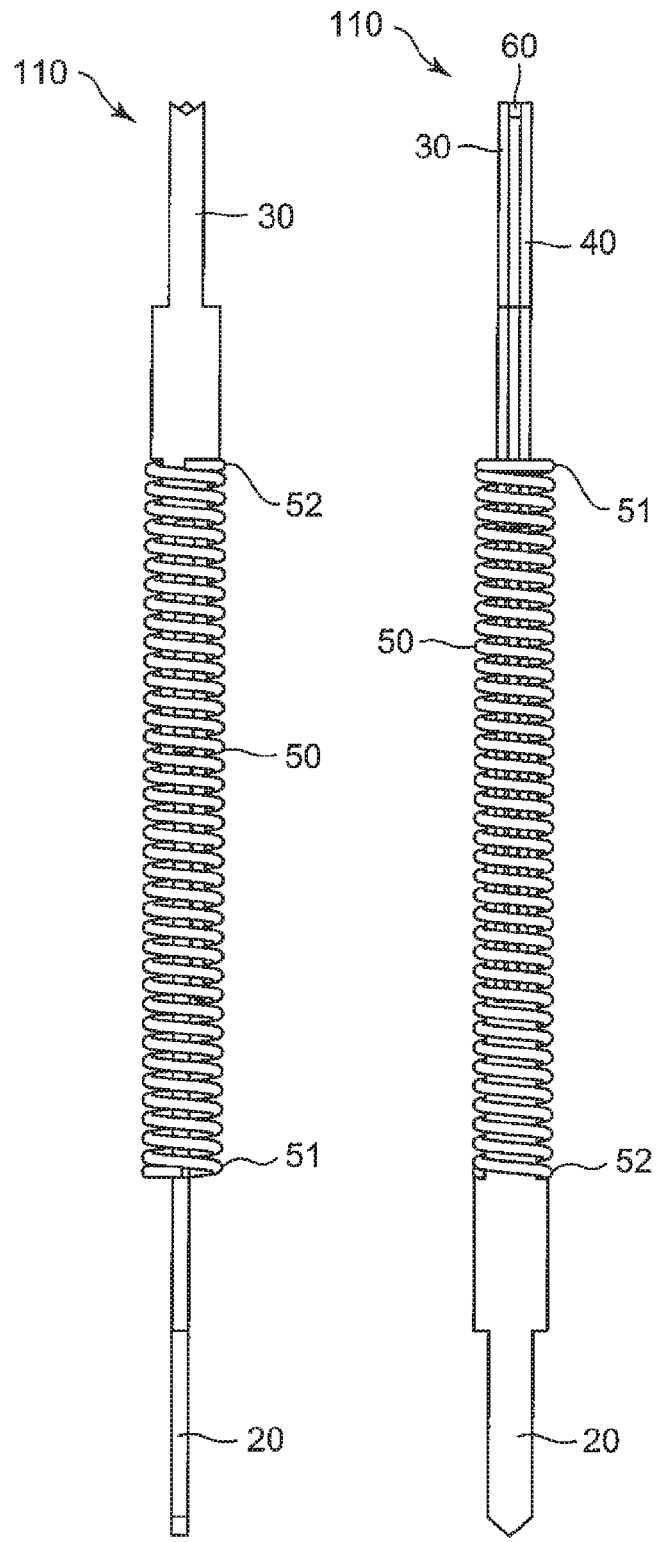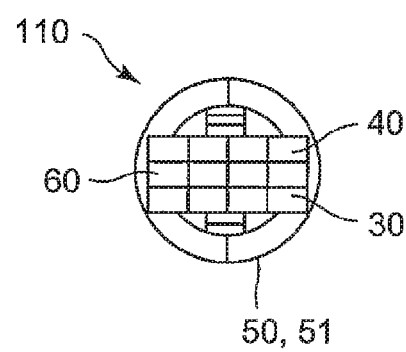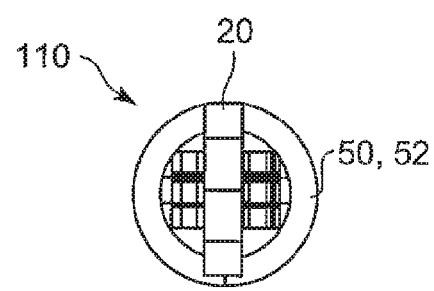

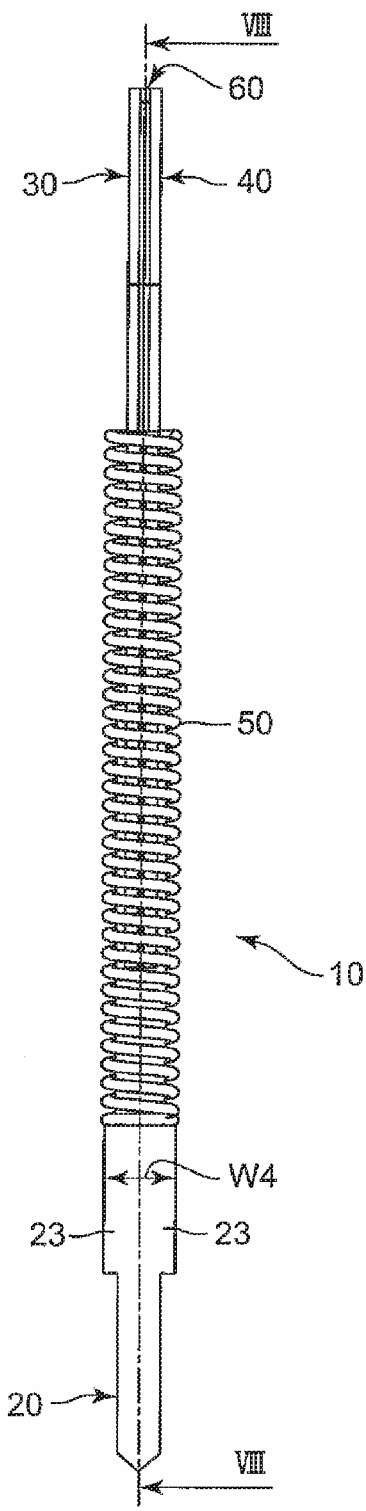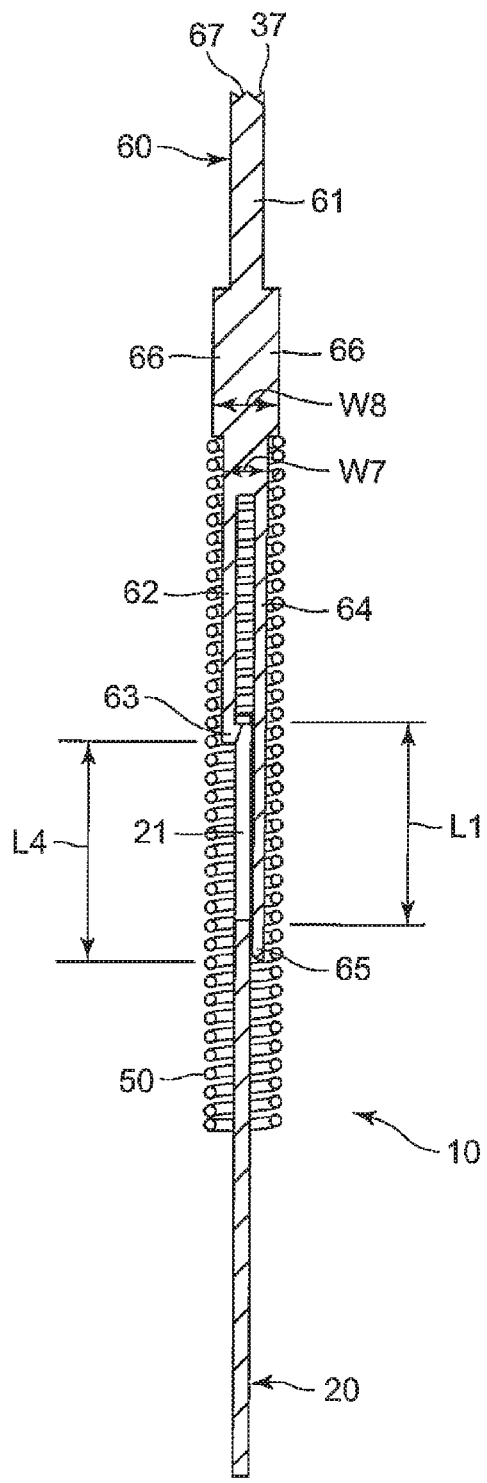

PROBE PIN AND ELECTRONIC DEVICE USING THE SAME

TECHNICAL FIELD

The present invention relates to a probe pin.

BACKGROUND ART

Conventionally, there has been proposed a probe pin disclosed, for example, in Patent Literature 1. The probe pin includes a first plunger and second and third plungers that are disposed with the first plunger held therebetween. Coil springs having different diameters are provided in the second and third plungers such that the second and third plungers can separately be moved in a slidable mariner (relative reciprocation).

CITATION LIST

Patent Literature

PTL 1: JP 2012-181096 A

SUMMARY OF INVENTION

Technical Problem

However, in the probe pin, the second and third plungers are biased by the outside coil spring and the inside coil spring having a smaller diameter than the outside coil spring. Therefore, the two coil springs biasing the second and third plungers interfere easily with each other, and a variation in slidable movement is easily generated in the second and third plungers with respect to the first plunger. Resultantly, no stable electric contact is obtained, undesirably.

Additionally, in the probe pin, because the coil spring is provided in each of the second and third plungers, the number of components and assembly man-hour are increased, which undesirably results in an increase in production cost.

In view of the above, a problem to be solved by the present invention is to provide a probe pin having high contact stability at low production cost.

Solution to Problem

According to an aspect of the present invention provided to solve the problem, a probe pin includes: a coil spring; a plurality of holding plungers having conductivity, being independently operable and including first and second elastic pieces extending from a main body in parallel in an identical direction to each other; and a held plunger having conductivety, the held plunger being inserted between each of the first and second elastic pieces of the holding plungers, characterized in that the plurality of holding plungers are inserted from a first end of the coil spring, the held plunger is inserted from a second end of the coil spring, and the held plunger is held between the first and second elastic pieces. held

Advantageous Effects of Invention

According to the present invention, the plurality of holding plungers are inserted from the first end of the single coil spring while the held plunger is inserted from the second end of the coil spring, and the held plunger is held between each of the first and second elastic pieces. Therefore, the variation in contact state is eliminated, and high contact stability and stable electric contact can be obtained between the holding and held plungers.

With the plurality of holding plungers operating independently, when dust adheres to one of the plurality of holding plungers, a conduction state of the probe pin can be maintained by the holding plunger to which no dust adheres. Therefore, the probe pin having the high contact stability can be obtained.

Further, as the holding plunger and the held plunger are inserted in the coil spring, the number of components and the assembly man-hour can be decreased and, consequently, the production cost can be suppressed.

In the probe pin according to an embodiment of the present invention, a number of the holding plungers are two.

According to the embodiment, the probe pin having higher freedom degree of design can he obtained.

In the probe pin according to the embodiment of the present invention, a number of the holding plungers are three.

According to the embodiment, the probe pin having higher freedom degree of design can be obtained.

In the probe pin according to the embodiment of the present invention, each of the holding plunger and the held plunger, which is formed by electroplating, includes a flat original plate surface and an irregular growth surface, and at least one set of the holding plungers adjacent to each other is disposed so that original plate surfaces of the holding plungers face each other.

The plurality of holding plungers is inserted in the coil spring and the original plate surfaces of the holding plungers face each other. Therefore, friction force between the holding plungers is reduced, and the holding plungers can slindingly move while being independent of each other.

In the probe pin of according to the embodiment of the present invention, a contact portion, which contacts with one of surfaces of the held plunger, protrudes from the first elastic piece of at least the holding plunger, and the holding plunger and the held plunger conduct to each other through the contact portion.

According to the embodiment, the contact portion of the holding plunger is in surface contact with the held plunger, so that the electric contact between the holding plunger and the held plunger can stably be obtained through the contact portion. Therefore, it is not necessary to strictly manage a dimensional tolerance of the component, and thus the production cost can be reduced.

In the probe pin according to the embodiment of the present invention, the first and second elastic pieces of the holding plunger are different from each other in length.

According to the embodiment, a freedom degree of design of the probe pin is increased, and the probe pin van be used in various applications.

In the probe pin according to the embodiment of the present invention, at least one of the first and second elastic pieces of the holding plunger includes a guide protrusion, the held plunger includes a guide groove in which the guide protrusion is engaged, and slide movement of the holding plunger and the held plunger is performed by movement of the protrusion along the guide groove.

According to the embodiment, the guide protrusion and the guide groove slindingly move the holding plunger and the held plunger without rattling, and a contact position at which the holding plunger and the held plunger contact with each other can correctly be detected.

According to another aspect of the present invention, an electrical device comprising the probe pin.

According to the present invention, the electronic device having the high contact stability can be obtained at low production cost.

BRIEF DESCRIPTION OF DRAWINGS

FIGS. 1A to 1D are four orthogonal views illustrating a probe pin according to a first embodiment of the present invention.

FIGS. 3A and 3B are perspective views illustrating before and after assembly of the probe pin in FIGS. 1A to 1D.

FIGS. 4A and 4B are sectional views illustrating the probe pin in FIGS. 1A to 1D.

FIGS. 5A and 5B are perspective views illustrating an operating state of the probe pin in FIGS. 1A to 1D.

FIGS. 6A to 6D are four orthogonal views illustrating a probe pin according to a second embodiment of the present invention.

FIGS. 9A and 9B are sectional views illustrating the probe pin in FIGS. 6A to 6D.

DESCRIPTION OF EMBODIMENTS (First Embodiment)

Figure 2A:
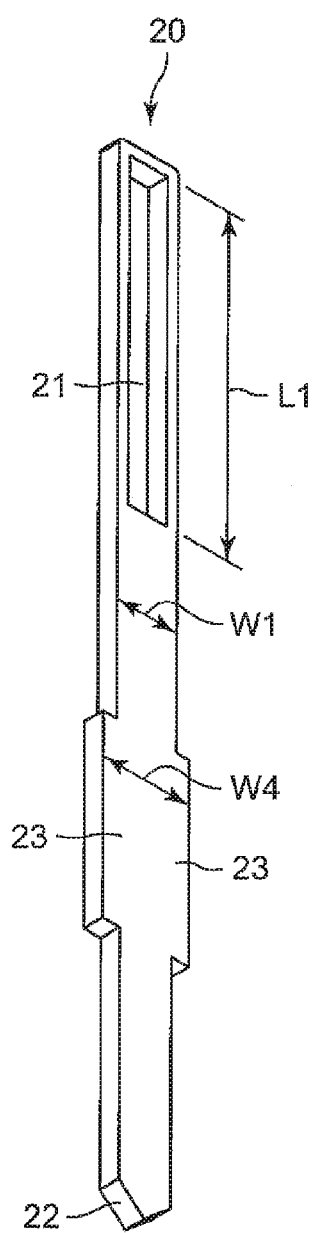
FIGS. 2A to 2C are perspective views illustrating plungers of the probe pin in FIGS. 1A to 1D.

FIGS. 1A to 1D are four orthogonal views illustrating a probe pin according to a first embodiment of the present invention.

As illustrated in FIGS. 1A to 1D, a probe pin 10 of the first embodiment includes a first plunger 20, a second plunger 30, a third plunger 40, and a coil spring 50. Each of the first to third plungers 20, 30, and 40 has electric conductivity, and is formed by, for example, electroforming. The first plunger 20 is an example of the held plunger, and the second and third plungers 30 and 40 are examples of the holding plunger.

In the probe pin 10 of the first embodiment, the first plunger 20 is inserted in the coil spring 50 from a first end 51 that is an end of the coil spring 50. The second and third plungers 30 and 40 are inserted in the coil spring 50 from a second end 52 that is the other end of the coil spring 50.

Figure 2B:
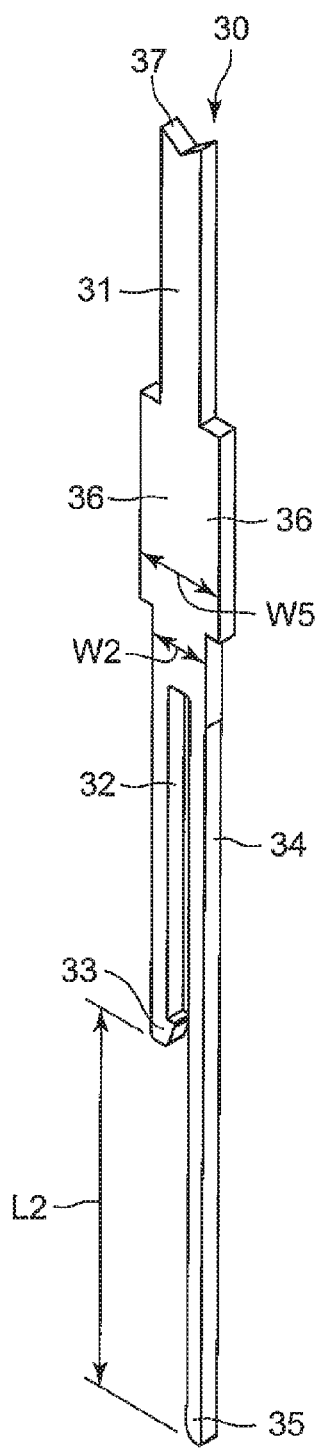
Figure 2C:
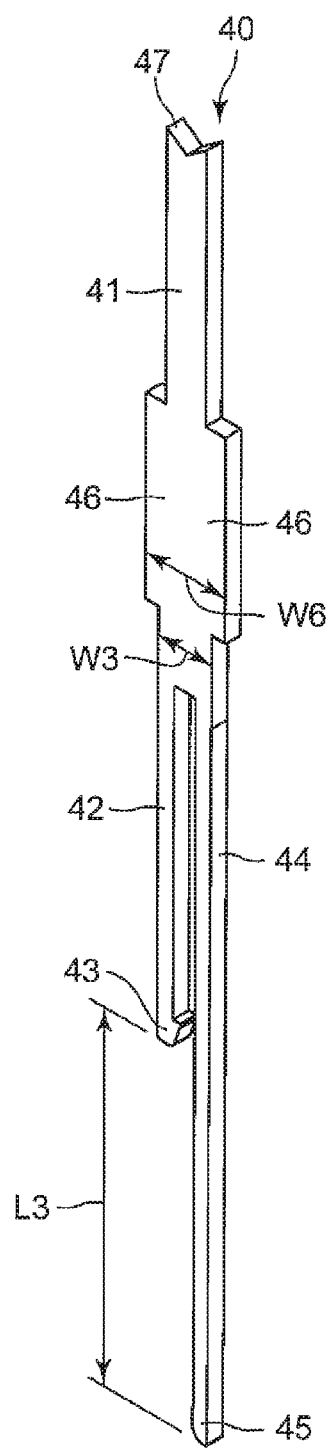

FIG. 2A is a perspective view illustrating the first plunger 20, FIG. 2B is a perspective view illustrating the second plunger 30, and FIG. 2C is a perspective view illustrating the third plunger 40.

As illustrated in FIG. 2A, the first plunger 20 has a substantially rectangular shape in planar view, and is formed with a substantially uniform thickness.

A guide groove 21 is provided at one end in a longitudinal direction of the first plunger 20. The guide groove 21 has a substantially rectangular shape in planar view, and extends along the longitudinal direction of the first plunger 20. A touch portion 22 having a substantially triangular shape in planar view is provided at the other end of the first plunger 20, which is the end on a side opposite to the guide groove 21. Further, support protrusions 23 are provided in both side surfaces of the first plunger 20.

As illustrated in FIG. 2B, the second plunger 30 includes a main body 31 and first and second elastic pieces 32 and 34, and is formed with a substantially uniform thickness.

The main body 31 has a substantially rectangular shape in planar view. The first and second elastic pieces 32 and 34 are provided at one end of the main body 31 in a longitudinal direction. A touch portion 37 having a substantial V-shape in planar view is provided at the other end of the main body 31, which is the end on a side opposite to the second elastic pieces 32 and 34. Further, support protrusions 36 are provided in both side surfaces of the main body 31, respectively.

The first and second elastic pieces 32 and 34 extend from the other end of the main body 31 in parallel to each other in the longitudinal direction of the main body 31. That is, the first and second elastic pieces 32 and 34 are disposed such that an interval between an inward surface of the first elastic piece 32 and an inward surface of the second elastic piece 34 is kept constant, and such that a distance between an outward surface of the first elastic piece 32 and an outward surface of the second elastic piece 34 is substantially equal to a width W2 of the main body 31.

The first and second elastic pieces 32 and 34 differ from each other in length, and the first elastic piece 32 is shorter than the second elastic piece 34. A guide protrusion 33 protrudes from a leading edge of the inward surface of the first elastic piece 32. A contact portion 35 protrudes from a leading edge in the inward surface of the second elastic piece 34.

It is assumed that L2 is a length difference between the first and second elastic pieces 32 and 34 of the second plunger 30.

As illustrated in FIG. 2C, the third plunger 40 includes a main body 41 and first and second elastic pieces 42 and 44, and is formed with a substantially uniform thickness. That is, the third plunger 40 has the same share and size as those of the second plunger 30.

The main body 41 has the substantially rectangular shape in planar view. The first and second elastic pieces 42 and 44 are provided at one end of the main body 41 in the longitudinal direction. A touch portion 47 having a substantial V-shape in planar view is provided at the other end of the main body 41, which is the end on a side opposite to the first and second elastic pieces 42 and 44. Further, support protrusions 46 are provided in both side surfaces of the main body 41.

The first and second elastic pieces 42 and 44 extend from the other end of the main body 41 in parallel to each other in the longitudinal direction of the main body 41. Therefore, the first and second elastic pieces 42 and 44 are disposed such that an interval between an inward surface of the first elastic piece 42 and an inward surface of the second elastic piece 44 is kept constant, and such that a distance between an outward surface of the first elastic piece 42 and an outward surface of the second elastic piece 44 is substantially equal to a width W3 of the main body 41.

The first and second elastic pieces 42 and 44 differ from each other in length, and the first elastic piece 42 is shorter than the second elastic piece 44. A guide protrusion 43 protrudes from a leading edge in the inward surface of the first elastic piece 42. A contact portion 45 protrudes from the leading edge in the inward surface of the second elastic piece 44.

It is assumed that L3 is a length difference between the first and second elastic pieces 42 and 44 of the second plunger 40.

The coil spring 50 is made of, for example, carbon steel or stainless steel. As illustrated in FIGS. 1A to 1D, the coil spring 50 has an inner diameter slightly larger than a width W1 (illustrated in FIG. 2A) of the first plunger 20, the width W2 of the second plunger 30, and the width W3 of the third plunger 40. The coil spring 50 has an outer diameter substantially equal to widths W4 of the support protrusions 23 of the first plunger 20, widths W5 of the support protrusions 36 of the second plunger 30, and widths W6 of the support protrusions 46 of the third plunger 40.

Note that, in the coil spring 50, a spring length is previously adjusted such that the coil spring 50 is compressed in the state in which the first plunger 20 and the second and third plungers 30 and 40 are assembled in each other.

The width W1 of the first plunger 20, the width W2 of the second plunger 30, and the width W3 of the third plunger 40 have the same size.

The support protrusions 23 of the first plunger 20, the support protrusions 36 of the second plunger 30, and the support protrusions 46 of the third plunger 40 have the same shape and width. That is, the width W4 of the support protrusions 23 of the first plunger 20, the width W5 of the support protrusions 36 of the second plunger 30, and the width W6 of the support protrusions 46 of the third plunger 40 have the same size.

FIGS. 3A and 3B are perspective views illustrating before and after assembly of the probe pin of the first embodiment. FIGS. 4A and 4B are sectional views illustrating the probe pin of the first embodiment, and FIGS. 5A and 5B are perspective views illustrating an operating state of the probe pin of the first embodiment.

The probe pin 10 is assembled as follows. As illustrated in FIG. 3A and FIG. 3B, while the first plunger 20 is inserted from the first end 51 of the coil spring 50, the second and third plungers 30 and 40, which are oriented toward the same direction and superposed on each other, are inserted from the second end 52 of the coil spring 50.

At this point, the first plunger 20 is inserted between the first elastic piece 32 and the second elastic piece 34 of the second plunger 30 and between the first elastic piece 42 and the second elastic piece 44 of the third plunger 40, whereby the first plunger 20 is movably held between the first elastic piece 32 and the second elastic piece 34 and between the first elastic piece 42 and the second elastic piece 44. Thus, as illustrated in FIG. 4B, the guide protrusions 33 and 43 of the first elastic pieces 32 and 42 are engaged with the guide groove 21 of the first plunger 20 (only the guide protrusion 33 of the second plunger 30 is illustrated in FIG. 4B). Therefore, slide movement of the second and third plungers 30 and 40 with respect to the first plunger 20 is performed along the guide groove 21. For this reason, slindingly moving ranges of the second and third plungers 30 and 40 are regulated to be within the guide groove 21 by the guide protrusions 33 and 43. Resultantly, the maximum moving amounts of the first to third plungers 20, 30, and 40 are equal to a length L1 of the guide groove 21.

In the probe pin 10, the width of the guide groove 21 is set larger than the widths of the guide protrusions 33 and 43. The interval between inward surface of the first elastic piece 32 and inward surface of the second elastic piece 34 and the interval between inward surface of the first elastic piece 42 and inward surface of the second elastic piece 44 are set larger than the thickness of the first plunger 20. Therefore, a friction resistance generated between the first plunger 20 and the second and third plungers 30 and 40 is reduced during the slide movement to facilitate the independently slide movement of the second and third plungers 30 and 40.

Note that, the second and third plungers 30 and 40 not only are inserted in the coil spring 50 while superposed on each other, but also may separately be inserted in the coil spring 50.

As illustrated FIG. 4B, the length. difference L2 between the first elastic piece 32 and the second elastic piece 34 of the second plunger 30 and the length difference L3 between the first elastic piece 42 and the second elastic piece 44 of the third plunger 4C are equal to or greater than the length L1 of the guide groove 21 of the first plunger 20. For this reason, the contact portion 35 of the second elastic piece 34 and the contact portion 45 of the second elastic piece 44 are always in contact with the first plunger 20, irrespective of the moving amount of the first to third plungers 20, 30, and 40.

As described above, the contact portion 35 of the second elastic piece 34 and the contact portion 45 of the second elastic piece 44 are always located at the first plunger 20 and in contact with one of surfaces of the first plunger 20. Therefore, the first plunger 20 and the second and third plungers 30 and 40 can stably electrically contact with each other, and the high contact stability can be obtained. Resultantly, it is not necessary to strictly manage a dimensional tolerance of the component compared to before, and thus the production cost can be reduced.

The first to third plungers 20, 30, and 40 slindingly move relative to each other along the guide groove 21. At this point, the first to third plungers 20, 30, and 40 slindingly move smoothly relative to each other by the guide protrusions 33 and 43 and the guide groove 21. This results in a precise identification of a contact position of the first plunger 20 and the second and third plungers 30 and 40.

When the first plunger 20 and the second and third plungers 30 and 40 are assembled in each other, both ends of the coil spring 50 are engaged with the support protrusion 23 of the first under 20 and the support protrusions 36 and 46 of the second and third plungers 30 and 40, respectively. This prevents dropping of the coil spring 50 and disassembling of the probe pin 10.

As illustrated in FIGS. 5A and 5B, in the probe pin 10, each of the second and third plungers 30 and 40 independently operates, namely, independently slindingly moves. Therefore, when, example, dust adheres to one of the touch portions 37 and 47 of the second and third plungers 30 and 40, a conduction stare of the probe pin 10 can he maintained by the other of the touch portions 37 and 47, to which no dust adheres. Therefore, the probe pin 10 having the high contact stability and, eventually, high contact reliability can be obtained.

Because the first to third plungers 20, 30, and 40 are formed by the electroforming, each of the first to third plungers 20, 30, and 40 includes a flat surface (what is called an original plate surface) that is in contact with an electric conductive member during the formation and a surface (what is called a growth surface) that has irregularity in a growth direction of metal deposited on the electric conductive member. In the probe pin 10, the second and third plungers 30 and 40 are respectively inserted in the coil spring 50 and the original plate surfaces of the second and third plungers 30 and 40 face each other. Therefore, friction force between the second and third plungers 30 and 40 is reduced, which facilitates the independently slide movement of the second and third plungers 30 and 40 while being independent of each other.

At this point, a friction coefficient Re acting on the original plate surfaces of the second and third plungers 30 and 40 is preferably less than 0.5 µm. With the preferable coefficient, the second and third plungers 30 and 40 can slindingly move while being surely independent of each other.

In the first plunger 20, a surface that is in contact with the contact portions 35 and 45 of the second elastic pieces 34 and 44 of the second and third plungers 30 and 40 may be the original plate surface. This allows friction force between the second and third plungers 30 and 40 to be reduced.

Additionally, in the probe pin 10 of the first embodiment, because each of the touch portion 37 of the second plunger 30 and the touch portion 47 of the third plunger 40 has what is called a crown shape, stable contact can be ensured when a contact member is a sphere (for example, a solder ball).

(Second Embodiment)

FIGS. 6A to 6O are four orthogonal views illustrating a probe pin according to a second embodiment of the present invention.

As illustrated FIGS. 6A to 6D, a probe pin 110 of the second embodiment includes the first plunger 20, the second plunger 30, the third plunger 40, a fourth plunger 60, and the coil spring 50. Each of the first to fourth plungers 20, 30, 40, and 60 has electric conductivity, and is formed by, for example, electroforming. The same component as the first embodiment is designated by the same reference sign, the description of the same component is not repeated and points different from the first embodiment are described.

In the probe pin 110 of the second embodiment, the first plunger 20 is inserted in the coil spring 50 from the first end. 51 that is one end of the coil spring 50. The second to fourth plungers 30, 40, and 60 are inserted in the coil spring 50 from the second end 52 that is the other end of the coil spring 50.

Figure 7A:
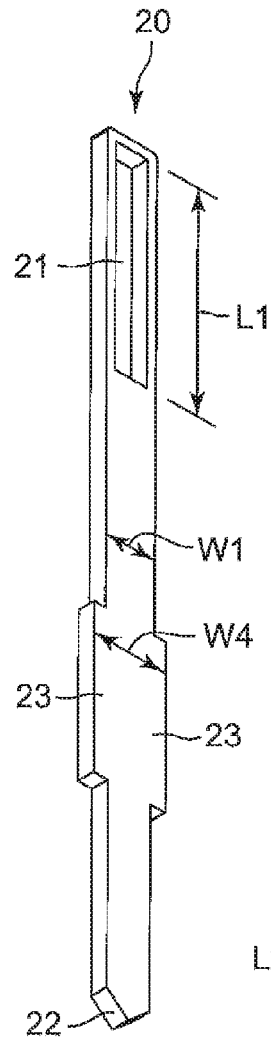
FIGS. 7A to 7D are perspective views illustrating plungers of the probe pin in FIGS. 6A to 6D.
Figure 7B:
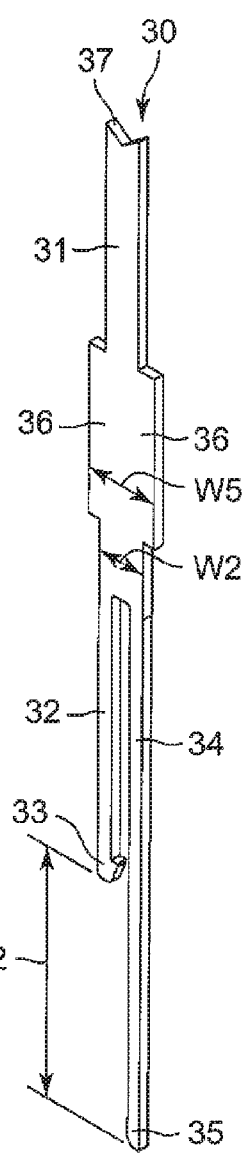
Figure 7C:
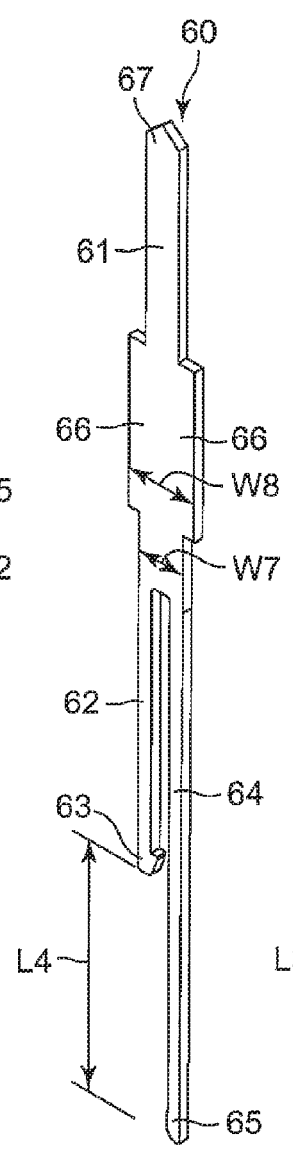
Figure 7D:
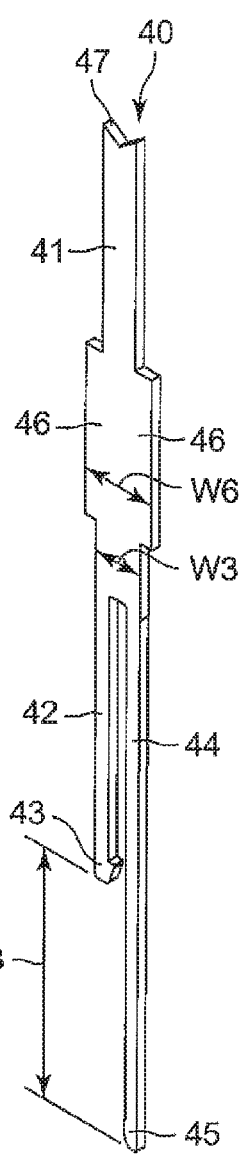

FIGS. 7A to 7D are perspective views illustrating the first to fourth plungers. FIG. 7A illustrates the first plunger 20, FIG. 7B illustrates the second plunger 30, FIG. 7C illustrates the fourth plunger 60, and FIG. 7D illustrates the third plunger 40.

As illustrated in FIG. 7C, the fourth plunger 60 includes a main body 61 and first and second elastic pieces 62 and 64, and is formed with a substantially uniform thickness. The fourth plunger 60 is an example of the holding plunger.

The main body 61 has the substantially rectangular shape in planar view. The first and second elastic pieces 62 and 64 are provided at one end in the longitudinal direction of the main body 61. A touch portion 67 having a substantial triangular shape in planar view is provided at the other end of the main body 61, which is the end on the side opposite to the first and second elastic pieces 62 and 64. Support protrusions 66 are provided in both side surfaces of the main body 61, respectively.

The first and second elastic pieces 62 and 64 extend from the other end in longitudinal direction of the main body 61 in parallel to each other in the longitudinal direction of the main body 61. That is, the first and second elastic pieces 62 and 64 are disposed such that an interval between an inward surface of the first elastic piece 62 and an inward surface of the second elastic piece 64 is kept constant, and such that a distance between an outward surface of the first elastic piece 62 and an outward surface of the second elastic piece 64 is substantially equal to a width W7 of the main body 61.

The first and second elastic pieces 62 and 64 differ from each other length, and the first elastic piece 62 is shorter than the second elastic piece 64. A guide protrusion 63 protrudes from a leading edge in the inward surface of the first elastic piece 62. A contact portion 65 protrudes from a leading edge in the inward surface of the second elastic piece 64.

That is, the fourth plunger 60 has the same shape as the second and third plungers 30 and 40 except for the touch portion 67.

It is assumed that L4 is a length difference between the first and second elastic pieces 62 and 64 of the second plunger 60.

The width W7 of the fourth plunger 60 has the same size as the width W1 of the first plunger 20, the width W2 of the second plunger 30, and the width W3 of the third plunger 40.

The support protrusions 66 of the fourth plunger 60, the support protrusions 23 of the first plunger 20, the support protrusions 36 of the second plunger 30, and the support protrusions 46 of the third plunger 40 have the same shape and width. That is, a width W8 of the support protrusions 66 of the fourth plunger 60 is equal to the width W4 of the support protrusions 23 of the first plunger 20, the width W5 of the support protrusions 36 of the second plunger 30, and the width W6 of the support protrusions 46 of the third plunger 40.

Figure 8A:
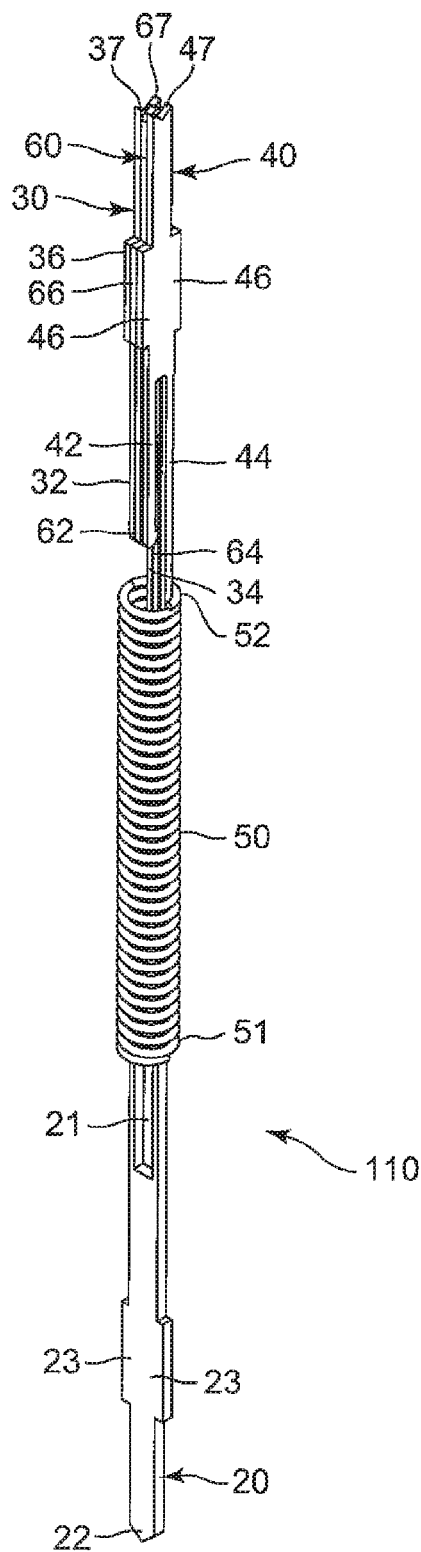
FIGS. 8A and 8B are perspective views illustrating before and after operating of the probe pin in FIGS. 6A to 6D.
Figure 8B:
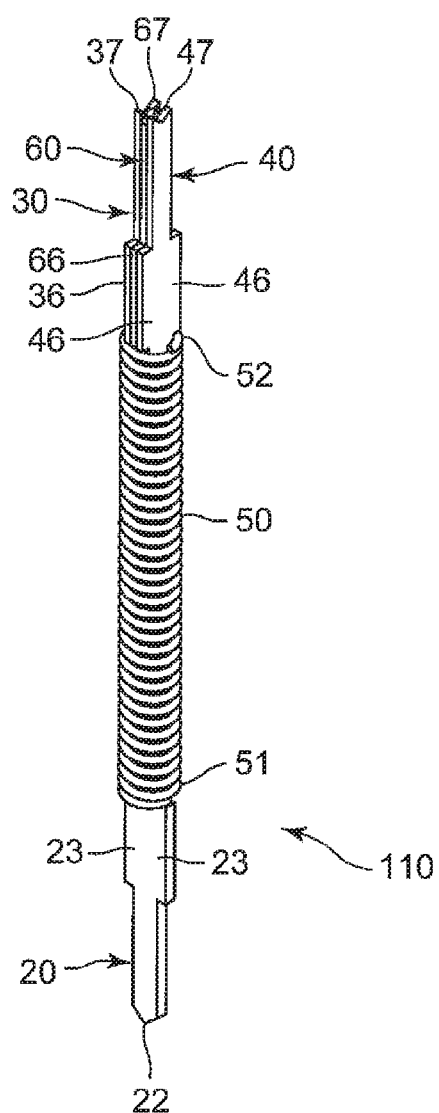

FIGS. 8A and 8B are perspective views illustrating before and after the assembly of the probe pin of the second embodiment. FIGS. 9A and 9B are sectional views illustrating the probe pin of the second embodiment.

The probe pin 110 is assembled as follows. As illustrated in FIGS. 8A and 8B, while the first plunger 20 is inserted from the first end 51 of the coil spring 50, the second to fourth plungers 30, 40, and 60 which are oriented toward the same direction and superposed on one another, are inserted from the second end 52 of the coil spring 50.

At this point, the first plunger 20 is inserted not only between the first elastic piece 32 and the second elastic piece 34 of the second plunger 30 and between the first elastic piece 42 and the second elastic piece 44 of the third plunger 40 but also between the first elastic piece 62 and the second elastic piece 64 of the fourth plunger 60, whereby the first plunger 20 is movably held between the first elastic piece 32 and the second elastic piece 34 of the second plunger 30, between the first elastic piece 42 and the second elastic piece 44 of the third plunger 40, and the first elastic piece 62 and the second elastic piece 64 of the fourth plunger 60. As illustrated in FIG. 9B, the guide protrusion 63 of the first elastic piece 62 of the fourth plunger 60 is engaged with the guide groove 21 of the first plunger 20. Therefore, slide movement of the fourth plunger 60 with respect to the first plunger 20 is performed along the guide groove 21. For this reason, the slindingly moving range of the fourth plunger 60 is regulated to be within the guide groove 21 by the guide protrusion 63. As a result, similarly to the first to third plungers 20, 30, and 40, the maximum moving amount of the fourth plunger 60 is equal to the length L1 of the guide groove 21.

In the probe pin 110, the width of the guide groove 21 is set larger than the width of the guide protrusion 63. The interval between inward surface of the first elastic piece 62 and inward surface of the second elastic piece 64 is set larger than the thickness of the first plunger 20. This allows the friction resistance generated between the first plunger 20 and the fourth plunger 60 during the slide movement to be reduced to facilitate the independently slide movement of the fourth plunger 60.

The second to fourth plungers 30, 40, and 60 not only are inserted in the coil spring 50 while superposed on each other, but also may separately be inserted in the coil spring 50.

As illustrated in FIG. 9B, the length difference L4 between the first elastic pieces 62 and the second elastic piece 64 of fourth plunger 60 is equal to or greater than the length L1 of the guide groove 21 of the first plunger 20. For this reason, the contact portion 65 of the second elastic piece 64 is always in contact with the first plunger 20, irrespective of the moving amount of the fourth plunger 60.

Further, in the probe pin 110, the second to fourth plungers 30, 40, and 60 are independently operated. Therefore, when, for example, dust adheres to one of touch portions 37, 47, and 67 of the second to fourth plungers 30, 40, and 60, the conduction state of the probe pin 10 can be maintained by any of the touch portions 37, 47, and 67 to which no dust adheres. Resultantly, the probe pin 110 having the high contact stability can be obtained.

Because the fourth plunger 60 is also formed by the electroforming, the fourth plunger 60 includes a flat surface (what is called an original plate surface) that is in contact with an electric conductive member during the formation and a surface (what is called a growth surface) that has irregularity in a growth direction of metal deposited on the electric conductive member. In the probe pin 110, the original plate surfaces of the second and third plungers 30 and 40 face each other, and the fourth plunger 60 is disposed between the second and third plungers 30 and 40. That is, the fourth plunger 60 is disposed such that the original plate of the fourth plunger 60 is in contact with at least one of the second and third plungers 30 and 40. This allows the friction force among the second to fourth plungers 30, 40, and 60 to be reduced. Consequently, the second to fourth plungers 30, 40, and 60 can slindingly move while being independent of one another.

A friction coefficient Ra that acts on the original plate surfaces of the second to fourth plungers 30, 40, and 60 when the original plate surfaces are in contact with each other is preferably less than 0.5 μm. With the preferable coefficient, the second to fourth plungers 30, 40, and 60 can slindingly move while being surely independent of one another.

The first plunger 20 may be disposed such that the original plate surface of the first plunger 20 is in contact with the contact portions 35, 45, and 65 of second elastic pieces 34, 44, and 64 of the second to fourth plungers 30, 40, and 60. This allows the friction force among the second to fourth plungers 30, 40, and 60 to be reduced.

Additionally, in the probe pin 110 of the second embodiment, because the touch portions 37, 47, and 67 of the second to fourth plungers 30, 40, and 60 has what is called a crown shape, stable contact can be ensured when a contact member is a sphere (for example, a solder ball).

(Other Embodiments)

Plural plungers may be disposed on the side of the first plunger 20, and more than four plungers may he disposed on the side of the second to fourth plungers 30, 40, and 60.

In the first and second embodiments, the shapes and sizes of the guide protrusions 33, 43, and 63 may properly be selected as long as the guide protrusions 33, 43, and 63 can be engaged with the guide groove 21 of the first plunger 20, and as long as the guide protrusions 33, 43, and 63 regulate the slide movement of the second to fourth plungers 30, 40, and 60 to be within the guide groove 21 when being engaged with the guide groove 21.

In the first and second embodiments, the shapes and sizes of the contact portions 35, 45, and 65 of the second elastic pieces 34, 44, and 64 of the second to fourth plungers 30, 40, and 60 can properly be selected according to design. Biasing force of the second elastic pieces 34, 44, and 64 to the first plunger 20 can be adjusted by changing the shapes of the contact portions 35, 45, and 65.

In the first and second embodiments, the length differences L2 to L4 between the first elastic pieces 32, 42, and 62 and the second elastic pieces 34 and 44 and 64 of the second to fourth plungers 30, 40, and 60 are substantially equal to the length L1 of he guide groove 21 of the first plunger 20. However, the length difference between the first and second elastic pieces can properly be changed as long as the length difference is longer than the length of the guide groove.

In the first and second embodiments, the first to fourth plungers 20, 30, 40, and 60 have the same thickness. However, the thicknesses of the first to fourth plungers may properly be changed. Each of the main bodies, the first and second elastic pieces, and the touch portions of the second to fourth plungers may have different thicknesses.

In the first to fourth plungers 20, 30, 40, and 60, surface treatment, such as plating or coating, may be performed according to design.

The probe pins 10 and 110 of the first and second embodiments may be used in an electronic device such as an IC test socket.

WORKING EXAMPLE

The contact stability of the probe pin according to the present invention was checked.

(Measurement Condition)

The probe pin of the first embodiment was used. In the probe pin, the Au plating was performed on the first to third plungers with the thickness of 1 μm or more. The probe pin contacted on an Au plate.

An insulation resistance value of the probe pin and an amount of change to loads of the second and third plunger were measured under the following conditions.

Figure 10:
FIG. 10 is a view illustrating a state of a touch portion (with dust on a half of the touch portion) of the probe pin used in WORKING EXAMPLE.

(1) The case that a Teflon (registered trademark) tape adheres to the whole touch portion of the second plunger (a half of the touch portion on the side of the second and third plungers of the probe pin) as illustrated in FIG. 10

Figure 11:
FIG. 11 is a view illustrating a state of the touch portion (with dust on a quarter of the touch portion) of the probe pin used in WORKING EXAMPLE.

(2) The case, that the Teflon tape adheres to about a half of the touch portion of the second plunger (a quarter of the touch portion on the side of the second and third plungers of the probe pin) as illustrated in FIG. 11

(3) The case that the Teflon tape does not adhere to the touch portion of the second plunger The Teflon tape having a thickness of 0.07 mm was used.

(Measurement Result Associated with Insulation Resistance Value (Including Conductor Resistance))

Figure 12:
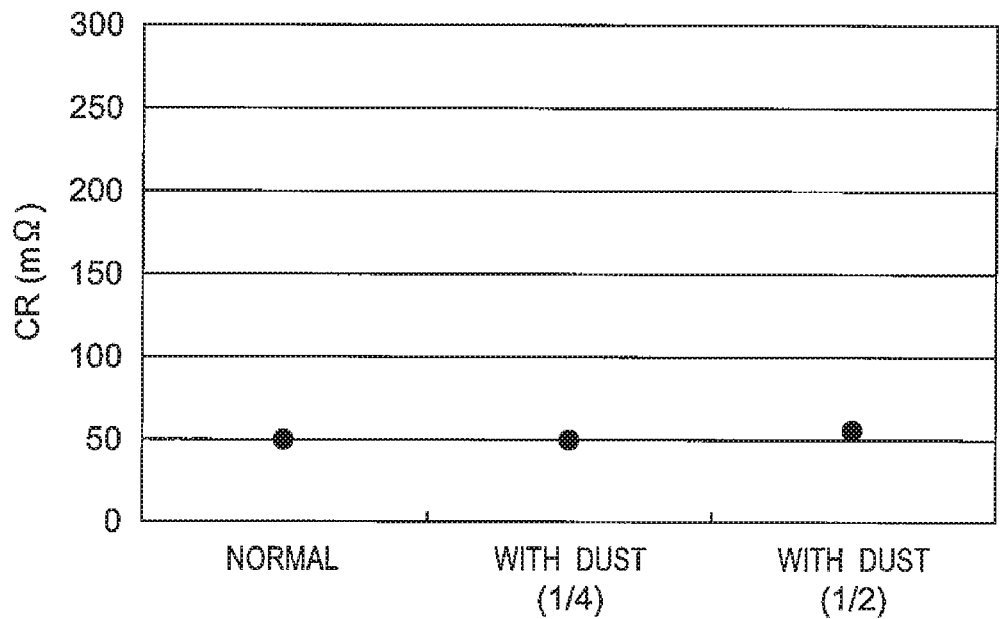
FIG. 12 is a view illustrating a result of WORKING EXAMPLE.

In the measurement result, the insulation resistance value was about 50 mΩ for the cases (1) to (3) as illustrated in FIG. 12.

(Discussion on Insulation Resistance Value)

From the measurement result associated with the insulation resistance value, it was confirmed that when dust (or dirt) adhered to one of the touch portions of the second and third plungers, the conduction state of the probe pin is maintained by the other touch portion to which no dust adhered.

(Measurement Result Associated with Amount of Change to Loads of Second and Third Plungers)

Figure 13:
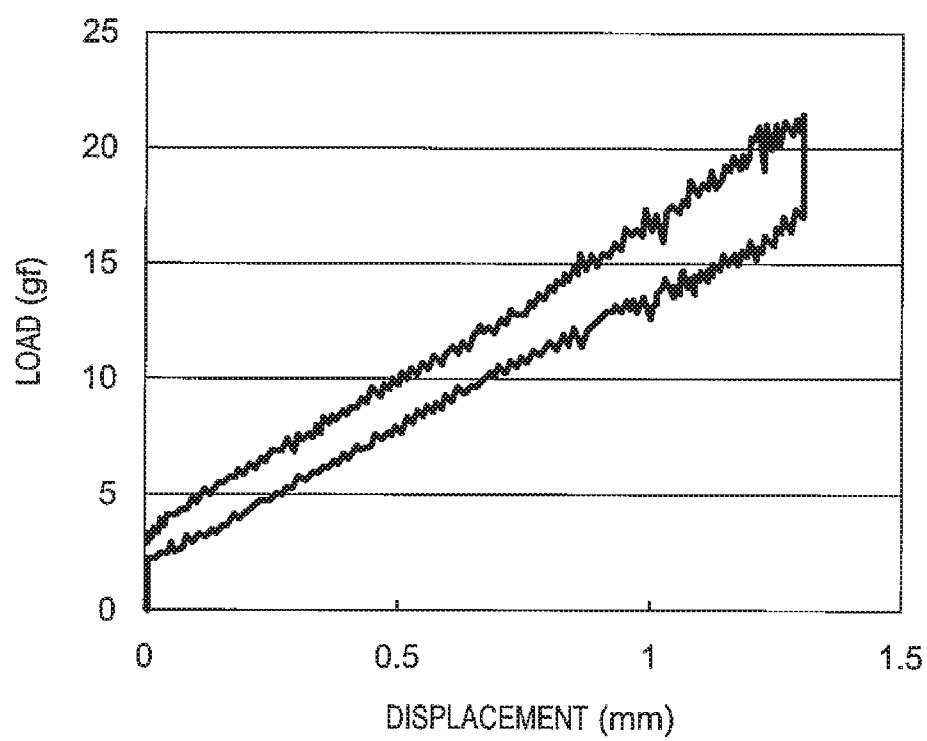
FIG. 13 is a view illustrating another result of WORKING EXAMPLE.
Figure 14:
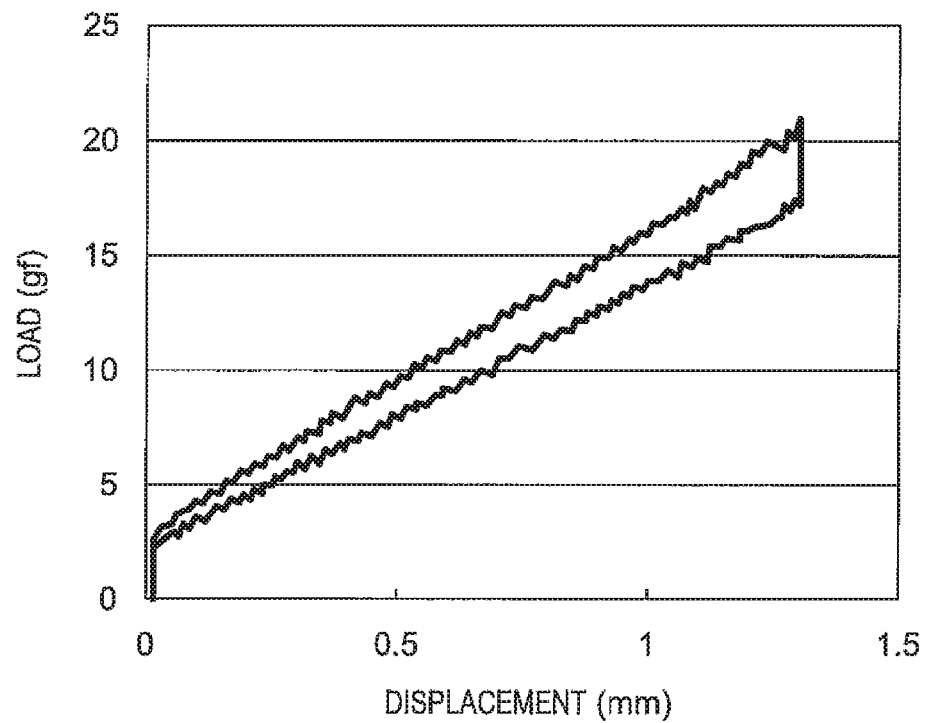
FIG. 14 is a view illustrating still another result of WORKING EXAMPLE.
Figure 15:
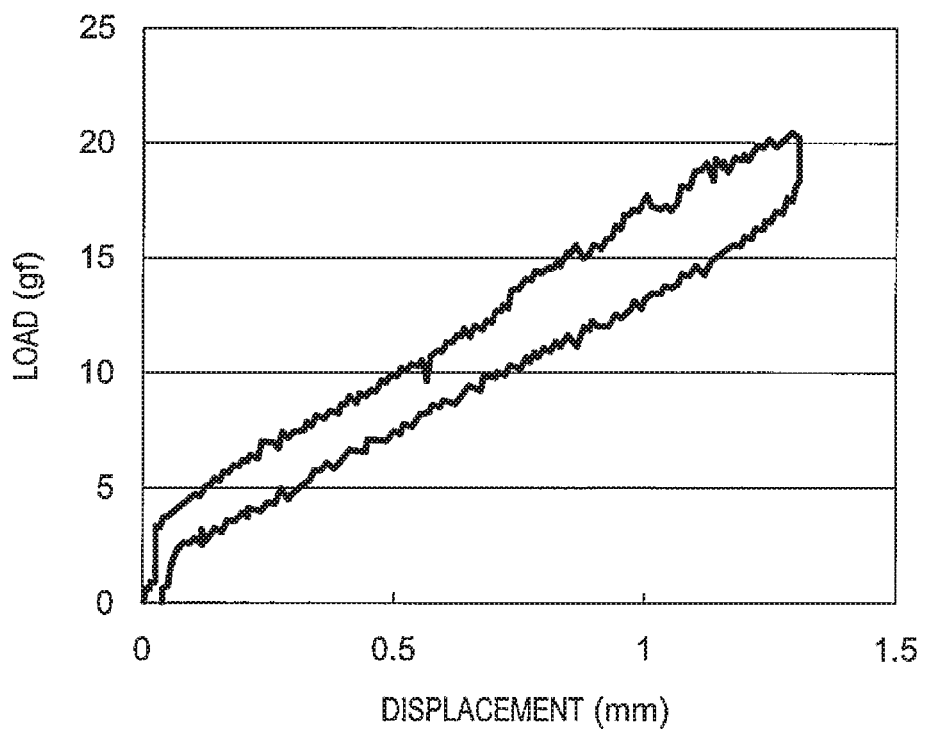
FIG. 15 is a view illustrating yet still another result of WORKING EXAMPLE.

In the measurement result, the amount of change (displacement) to the loads of the second and third plungers was substantially equal for the cases (1) to (3) as illustrated in FIGS. 13 to 15.

(Discussion on Amount of Change to Loads of Second and Third Plungers)

From the measurement result associated with the amount of change to the loads of the second and third plungers, it was confirmed that when dust adhered to one of the touch portions of the second and third plungers, the operation of the probe pin is not influenced.

INDUSTRIAL APPLICABILITY

The probe pin of the present invention is not limited to that in any one of the first and second embodiments provided that it includes at least a plurality of plungers each operating independently.

REFERENCE SIGNS LIST 10. probe pin
20. first plunger
21. guide groove
22. touch portion
23. support protrusion
30. second plunger
31. main body
32. first elastic piece
33. guide protrusion
34. second elastic piece
35. contact portion
36. support protrusion
37. touch portion
40. third plunger
41. main body
42. first elastic piece
43. guide protrusion
44. second elastic piece
45. contact portion
46. support protrusion
47. touch portion
50. coil spring
51. first end
52. second end
60. fourth plunger
61. main body
62. first elastic piece
63. guide protrusion
64. second elastic piece
65. contact portion
66. support protrusion
67. touch portion
110. probe pin

The invention claimed is:

1. A probe pin, comprising:
a coil spring;
a plurality of holding plungers having electric conductivity, being independently operable and including first and second elastic pieces extending from a main body in parallel in an identical direction to each other; and
an held plunger having electric conductivity and being inserted between the first and second elastic pieces of each of the holding plungers, wherein
the plurality of holding plungers are inserted from a first end of the coil spring, the held plunger is inserted from a second end of the coil spring, and the held plunger is held between the first and second elastic pieces.

2. The probe pin as claimed in claim 1, wherein
a number of the holding plungers are two.

3. The probe pin as claimed in claim 1, wherein
a number of the holding plungers are three.

4. The probe pin as claimed in claim 1, wherein
each of the holding plunger and the held plunger, which is formed by electroplating, includes a flat original plate surface and an irregular growth surface, and at least one set of the holding plungers adjacent to each other is disposed so that the original plate surfaces of the holding plungers face each other.

5. The probe pin as claimed in claim 1, wherein
a contact portion, which contacts with one of surfaces of the held plunger, protrudes from the first elastic piece of at least the holding plunger, and the holding plunger and the held plunger conduct to each other through the contact portion.

6. The probe pin as claimed in claim 1, wherein
the first and second elastic pieces of the holding plunger are different from each other in length.

7. The probe pin as claimed in claim 1, wherein
at least one of the first and second elastic pieces of the holding plunger includes a guide protrusion, the held plunger includes a guide groove in which the guide protrusion is engaged, and slide movement of the holding plunger and the held plunger is performed by movement of the guide protrusion along the guide groove.

8. An electrical device comprising a probe pin claimed in claim 1.

* * * * *